(12) United States Patent
Tamura et al.

(10) Patent No.: US 8,754,969 B2
(45) Date of Patent: Jun. 17, 2014

(54) PHOTOELECTRIC CONVERSION APPARATUS AND METHOD OF MANUFACTURING PHOTOELECTRIC CONVERSION APPARATUS

(75) Inventors: Seiichi Tamura, Yokohama (JP); Mayu Ishikawa, Kawasaki (JP); Aiko Kato, Machida (JP); Masatsuga Itahashi, Yokohama (JP); Kouhei Hashimoto, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 59 days.

(21) Appl. No.: 13/473,460

(22) Filed: May 16, 2012

(65) Prior Publication Data

US 2012/0300102 A1    Nov. 29, 2012

(30) Foreign Application Priority Data

May 27, 2011    (JP) ................................ 2011-119260

(51) Int. Cl.
*H04N 3/14* (2006.01)
*H04N 9/04* (2006.01)
(52) U.S. Cl.
USPC .......................................... 348/294; 348/302
(58) Field of Classification Search
CPC ........ H04N 5/335; H04N 5/378; H04N 3/155
USPC ............................................ 348/294, 302, 308
See application file for complete search history.

(56) References Cited

U.S. PATENT DOCUMENTS

| 7,030,918 | B1 * | 4/2006 | Nakashiba | 348/294 |
| 2007/0196947 | A1 * | 8/2007 | Yoo et al. | 438/57 |
| 2010/0214453 | A1 * | 8/2010 | Murata | 348/266 |
| 2010/0225776 | A1 * | 9/2010 | Taura | 348/222.1 |
| 2011/0273599 | A1 * | 11/2011 | Murata | 348/294 |
| 2012/0012964 | A1 * | 1/2012 | Kishi | 257/435 |

FOREIGN PATENT DOCUMENTS

JP    2009-109965 A    5/2009

* cited by examiner

*Primary Examiner* — Gevell Selby
(74) *Attorney, Agent, or Firm* — Canon USA, Inc. IP Division

(57) ABSTRACT

In a photoelectric conversion apparatus including a plurality of focus detection pixels, each focus detection pixel including a photoelectric conversion element, the photoelectric conversion element having a light receiving surface, and a plurality of wiring layers to read a signal supplied by the photoelectric conversion element, the photoelectric conversion apparatus further includes a light shielding film covering a part of the photoelectric conversion element and having the lower surface positioned closer to a plane, which includes a light receiving surface of the photoelectric conversion element and which is parallel to the light receiving surface, than a lower surface of the lowermost one of the plurality of wiring layers.

15 Claims, 8 Drawing Sheets

PHOTOELECTRIC CONVERSION APPARATUS AND METHOD OF MANUFACTURING PHOTOELECTRIC CONVERSION APPARATUS

BACKGROUND OF THE INVENTION

1. Field of the Invention

One disclosed aspect of the embodiments relates to a photoelectric conversion apparatus and a method of manufacturing the photoelectric conversion apparatus.

2. Description of the Related Art

Digital video cameras and digital still cameras with the focus detection function have become prevalent in common uses. Photoelectric conversion apparatuses of the CCD type and the CMOS type are employed in those cameras. There is proposed a photoelectric conversion apparatus which incorporates therein pixels to perform focus detection in accordance with the pupil division phase difference method as one focus detection method. Japanese Patent Laid-Open No. 2009-109965 discloses a photoelectric conversion apparatus incorporating therein pixels for focus detection, each of which is provided by shielding a portion of a photoelectric conversion element against light with a light shielding film. However, Japanese Patent Laid-Open No. 2009-109965 includes no discussion regarding the arrangement of the light shielding film, which determines the feature of the pixels for focus detection. The arrangement of the light shielding film is important from the viewpoint of accurately performing the focus detection.

SUMMARY OF THE INVENTION

One disclosed aspect of the embodiments provides the arrangement of a light shielding film to accurately perform the focus detection, and a method of manufacturing the light shielding film.

According to an embodiment, there is provided a photoelectric conversion apparatus including a plurality of focus detection pixels, each focus detection pixel including a photoelectric conversion element, the photoelectric conversion element having a light receiving surface, and a plurality of wiring layers to read a signal supplied by the photoelectric conversion element, wherein the photoelectric conversion apparatus further includes a light shielding film covering a part of the photoelectric conversion element and having a lower surface positioned closer to a plane, which includes the light receiving surface of the photoelectric conversion element and which is parallel to the light receiving surface, than a lower surface of the lowermost one of the plurality of wiring layers.

According to another embodiment, there is provided a method of manufacturing a photoelectric conversion apparatus comprising a plurality of focus detection pixels each including a photoelectric conversion element, and a plurality of wiring layers to read a signal supplied by the photoelectric conversion element, the method including the steps of forming an insulating film that covers the photoelectric conversion element, forming a contact hole in the insulating film, forming a contact plug in the contact hole, forming a groove in the insulating film, the groove overlying a part of the photoelectric conversion element, and forming an opaque film in the groove.

According to still another embodiment, there is provided a method of manufacturing a photoelectric conversion apparatus including a plurality of focus detection pixels each including a photoelectric conversion element, and a plurality of wiring layers to read a signal supplied by the photoelectric conversion element, the method including the steps of forming a first insulating film that covers the photoelectric conversion element, forming an opaque film that covers the first insulating film, patterning the opaque film to form a light shielding film that covers a part of the photoelectric conversion element, forming a second insulating film that covers the light shielding film, and forming the lowermost one of the plurality of wiring layers on the second insulating film.

Further features of the disclosure will become apparent from the following description of exemplary embodiments with reference to the attached drawings.

DESCRIPTION OF THE EMBODIMENTS

A photoelectric conversion apparatus according to one embodiment includes a plurality of focus detection pixels each including a photoelectric conversion element, and a plurality of wiring layers disposed above the focus detection pixels. The photoelectric conversion apparatus further includes a light shielding film covering a part of the photoelectric conversion element and having a lower surface positioned closer to a surface of the photoelectric conversion element than a lower surface of the lowermost one of the plurality of wiring layers. With the presence of the light shielding film thus arranged, pupil division is made at a position close to the surface of the photoelectric conversion element, whereby accuracy in focus detection may be increased.

According to other embodiments, there are provided methods of manufacturing a photoelectric conversion apparatus including a plurality of focus detection pixels each including a photoelectric conversion element, and a plurality of wiring layers. The manufacturing method according to one embodiment includes the steps of forming an insulating film that covers the photoelectric conversion element, forming a contact hole in the insulating film, forming a contact plug in the contact hole, forming a groove in the insulating film, the groove overlying a part of the photoelectric conversion element, and forming an opaque film in the groove. The manufacturing method according to the other embodiment includes the steps of forming a first insulating film that covers the photoelectric conversion element, forming an opaque film that covers the first insulating film, patterning the opaque film to form a light shielding film that covers a part of the photoelectric conversion element, forming a second insulating film that covers the light shielding film, and forming the lowermost one of the plurality of wiring layers on the second insulating film. With those manufacturing methods, the light shielding film enabling the focus detection to be performed with high accuracy may be easily formed.

In the following description of the embodiments, a direction toward the inside of a semiconductor substrate from a surface of the semiconductor substrate is defined as a downward direction, and a direction opposed to that direction is defined as an upward direction. Further, the wiring layer includes a plurality of wiring patterns. Thus, an upper surface and a lower surface of the wiring layer may also be said, respectively, as an upper surface and a lower surface of the wiring patterns.

First Embodiment

A photoelectric conversion apparatus according to a first embodiment will be described below with reference to FIGS. 1 to 4B. First, a pixel circuit and an image pickup region in the photoelectric conversion apparatus according to the first embodiment are described with reference to FIGS. 3A and 3B.

Figure 3A:
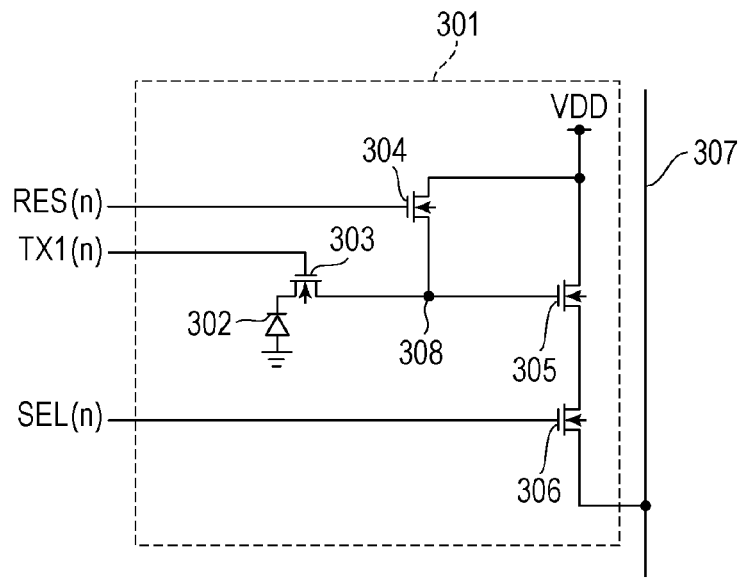
FIG. 3A is a circuit diagram to explain the photoelectric conversion apparatus according to the first embodiment.

FIG. 3A is a circuit diagram of one pixel. Each of pixels for image pickup and pixels for focus detection in the photoelectric conversion apparatus according to the first embodiment has the circuit configuration illustrated in FIG. 3A. The following description is made on condition that, in FIG. 3A, a transistor is an N-type MOSFET and signal carriers (charge carriers) are electrons. Referring to FIG. 3A, a pixel 301 includes a photodiode (hereinafter referred to as a "PD") 302 as a photoelectric conversion element, and a plurality of transistors. The plurality of transistors include a transfer transistor 303, a reset transistor 304, an amplification transistor 305, and a selection transistor 306. The transfer transistor 303 transfers the signal carriers from the PD 32, which is connected to a source of the transfer transistor 303, to a floating diffusion portion (hereinafter referred to as a "FD portion") that is connected to a drain of the transfer transistor 303. A node 308 in FIG. 3A is a node of the FD portion. The node 308 includes the drain of the transfer transistor 303, a gate electrode of the amplification transistor 305, and a source of the reset transistor 304. The amplification transistor 305 outputs a signal depending on a potential of the FD portion, i.e., a signal depending on the signal carriers. The selection transistor 306 is connected to a signal line 307, and it controls the timing of outputting the signal from the amplification transistor 305. The reset transistor 304 resets the potential of the FD portion. In other words, the reset transistor 304 drains the signal carriers having been transferred to the FD portion.

In this embodiment, each of the image pickup pixels and the focus detection pixels has the pixel circuit described above. The photoelectric conversion element is not limited to the photodiode, and it may be, e.g., a photogate. Further, a plurality of transistors may be shared by a plurality of photoelectric conversion elements. Thus, the circuit configuration may be optionally modified in such a manner as, for example, using a pixel circuit including no selection transistor, or using a P-type MOSFET as the amplification transistor.

Figure 3B:
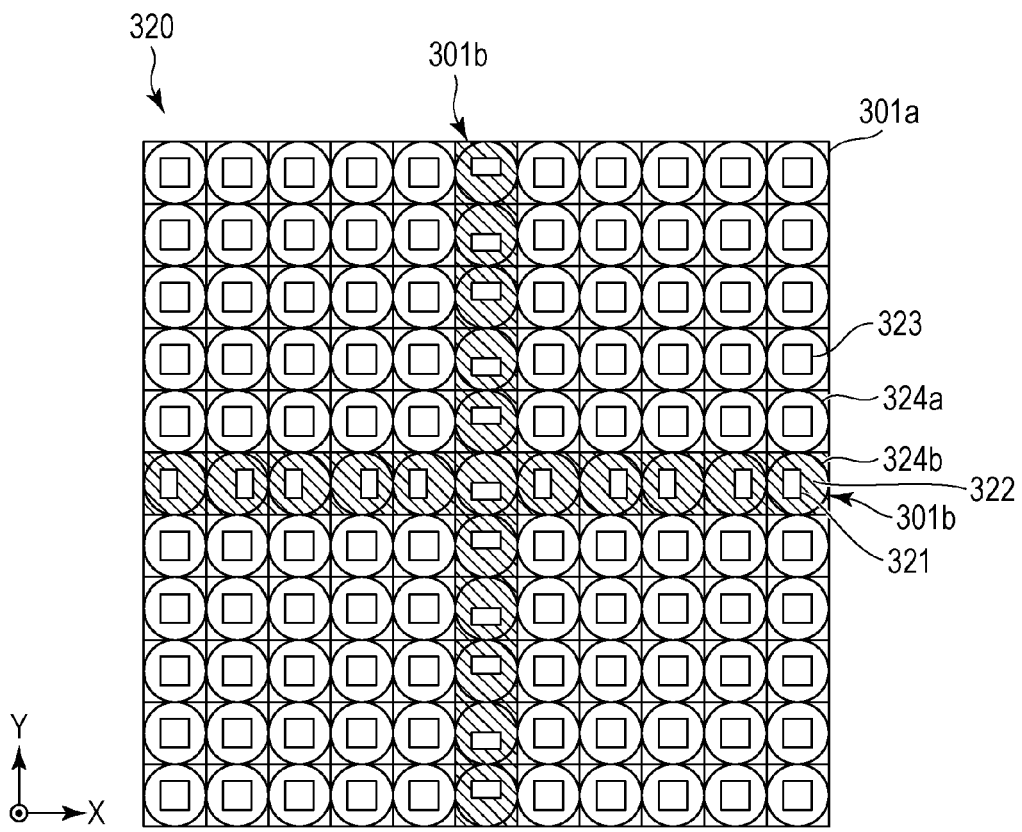
FIG. 3B is a plan view to explain the photoelectric conversion apparatus according to the first embodiment.

FIG. 3B is a schematic plan view of the photoelectric conversion apparatus including the pixels for image pickup and the pixels for focus detection. An image pickup region 320 includes the pixels 301, each having the circuit illustrated in FIG. 3A, which are arrayed in two-dimensional pattern. In the image pickup region 320, image pickup pixels 301a and focus detection pixels 301b are arrayed in the XY-directions. The focus detection pixels 301b are arrayed in one row (X-direction) and in one column (Y-direction), the one row and the one column crossing at a center of the image pickup region 320. In other words, the focus detection pixels 301b are arranged in the cruciform. However, the arrangement of the focus detection pixels 301b may be optionally changed.

In FIG. 3B, optical elements, i.e., a microlens 324a and a microlens 324b in this embodiment, for condensing light to the photoelectric conversion elements are arranged corresponding to the image pickup pixel 301a and the focus detection pixel 301b respectively. The photoelectric conversion element in the image pickup pixel 301a has a light receiving surface 323. The focus detection pixel 301b has a light shielding film 322 with an opening 321. The light shielding film 322 is denoted as a hatched area. The photoelectric conversion element in the focus detection pixel 301b also has a light receiving surface similar to the light receiving surface 323 of the photoelectric conversion element in the image pickup pixel 301a, but the light receiving surface in the focus detection pixel 301b is partly covered with the light shielding film 322. The focus detection is performed by obtaining signals of pupil-divided images for measurement of a phase difference with the focus detection pixels 301b arranged as described above. Signals for use in creating an image are obtained by using the image pickup pixels 301a other than the focus detection pixels 301b. The light shielding film in the focus detection pixel 301b will be described below with reference to FIG. 1.

Figure 1:
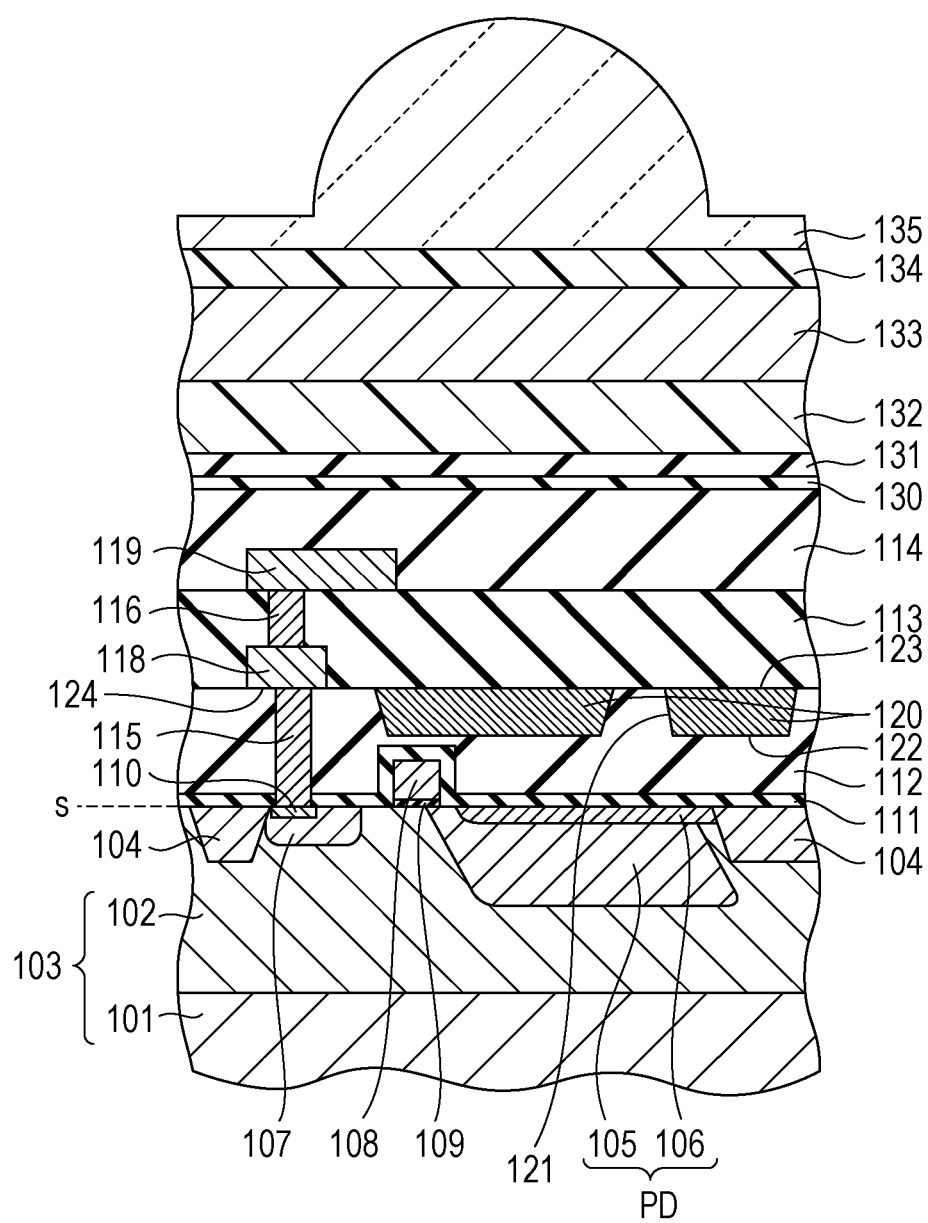
FIG. 1 is a sectional view to explain a photoelectric conversion apparatus according to a first embodiment.

FIG. 1 is a schematic sectional view of a portion of the photoelectric conversion apparatus according to the first embodiment, the portion including the PD and the transfer transistor in the focus detection pixel 301b. The photoelectric conversion apparatus includes a semiconductor substrate 103 in which the PD and the transfer transistor are disposed. The semiconductor substrate 103 has a surface S, and it may include a parent material portion 101 of an N-type silicon semiconductor substrate and a semiconductor region 102 formed on the parent material portion 101. The semiconductor substrate may further include an epitaxial layer. The semiconductor region 102 may be a part of the parent material portion 101 or an N-type semiconductor region that is formed by ion implantation. In this embodiment, the semiconductor region 102 is a P-type semiconductor region formed by ion implantation. The PD includes an N-type semiconductor region 105 for accumulating the signal carriers, and a P-type semiconductor region 106 disposed on the N-type semiconductor region 105. The surface of the PD, i.e., the light receiving surface thereof, is parallel to the surface S of the semiconductor substrate 103 and is included in the surface S. The transfer transistor has a gate electrode 108 disposed on a gate insulating film 109. The source of the transfer transistor is integral with the semiconductor region 105, and the drain of the transfer transistor is integral with an N-type semiconductor region 107. The N-type semiconductor region 107 serves as the so-called FD portion. On the side of the semiconductor region 107 closer to the surface S of the semiconductor substrate 103, a semiconductor region 110 having a higher impurity concentration than the semiconductor region 107 is disposed for conduction to a contact plug 115. Individual elements each including the PD and the FD portion are isolated from each other by an element isolation region 104. The element isolation region 104 is formed by the STI method or the LOCOS method. An insulating film integral with the gate insulating film 109 or a separate insulating film may be disposed on the PD and the FD portion, i.e., on the surface S. The gate insulating film 109 or the separate insulating film is made of silicon oxide, for example.

Over the above-described elements, insulating films 111 to 114 are disposed on that order starting from the surface S of the semiconductor substrate 103. The insulating film 111 is made of silicon nitride, is disposed around the contact plug 115, and is arranged to cover the light receiving surface of the PD. The insulating films 112 to 114 are made of silicon oxide and function as the so-called interlayer insulating films. The insulating films 112 to 114 are disposed between the semiconductor substrate 103 and a lowermost wiring layer, between adjacent wiring layers, and on an uppermost wiring layer. Over the insulating film 114, for example, an antireflection film 130 made of silicon oxynitride and a protection film 131 made of silicon nitride are disposed in that order as viewed from the surface S of the semiconductor substrate 103. Over the protection film 131, a planarizing film 132 made of an organic resin, a color filter 133, a planarizing film 134 made of an organic resin, and a microlens 135 are disposed in that order as viewed from the surface S of the semiconductor substrate 103. Another antireflection film may be further disposed between the protection film 131 and the planarizing film 132.

A plurality of wiring layers, a contact plug, and a via plug are arranged between adjacent twos of the insulating films 111 to 114. The contact plug 115 connected to the element in the semiconductor substrate 103 is surrounded at its lateral surface by the insulating film 111 and the insulating film 112. An upper surface of the contact plug 115 is at the same height as an upper surface of the insulating film 112. Here, the term "height" implies a height (i.e., a distance) from the surface S of the semiconductor substrate 103. A first wiring layer 118 connected to the contact plug 115 is disposed on the contact plug 115 and the insulating film 112. A lower surface 124 of the first wiring layer 118 is at the same height as the upper surface of the insulating film 112. The expression "same height" includes the case of substantially the same height, e.g., the case where heights differ from each other by an amount corresponding to an error in manufacturing a semiconductor apparatus, i.e., a photoelectric conversion apparatus. A via plug 116 connected to the first wiring layer 118 is arranged in the insulating film 113. Further, a second wiring layer 119 connected to the via plug 116 is disposed on the insulating film 113 and is covered with the insulating film 114. The first wiring layer 118 is disposed closest to the surface S of the semiconductor substrate 103 among the plurality of wiring layers. In other words, the wiring layer 118 is the lowermost one among the plurality of wiring layers.

In the focus detection pixel 301b thus constructed, a light shielding film 120 covering a part of the PD is disposed on the PD. The light shielding film 120 is formed of an opaque film and is made of, e.g., an organic material such as a black resin, an inorganic material such as silicon carbide, or a metal material such as tungsten. The opaque film may be any type of film as long as it has low transmittance, and it may be not perfectly opaque. This embodiment represents the case where the opaque film is made of tungsten as one example of the metal material. An opening 121 is formed in the light shielding film 120, and light entering the PD is not blocked in the opening 121. The light shielding film 120 has a lower surface 122 closer to the PD side and an upper surface 123 on the side apart away from the PD. The light shielding film 120 is positioned closer to the surface S of the semiconductor substrate 103 than the wiring layer 118 that is positioned closest to the surface S of the semiconductor substrate 103 among the plural wiring layers. Thus, the light shielding film 120 is arranged at a position lower than the wiring layer 118 that is arranged closest to the surface S of the semiconductor substrate 103. More specifically, the lower surface 122 of the light shielding film 120 is closer to the surface S of the semiconductor substrate 103 than the lower surface 124 of the wiring layer 118. With the provision of the light shielding film 120 thus arranged, pupil division is made at a position close to the surface of the photoelectric conversion element, whereby accuracy in the focus detection may be increased. Here, the expression "high" and "low" implies a relative height (higher in the upward direction) when the surface S of the semiconductor substrate 103 is defined as a basis.

Figure 8A:
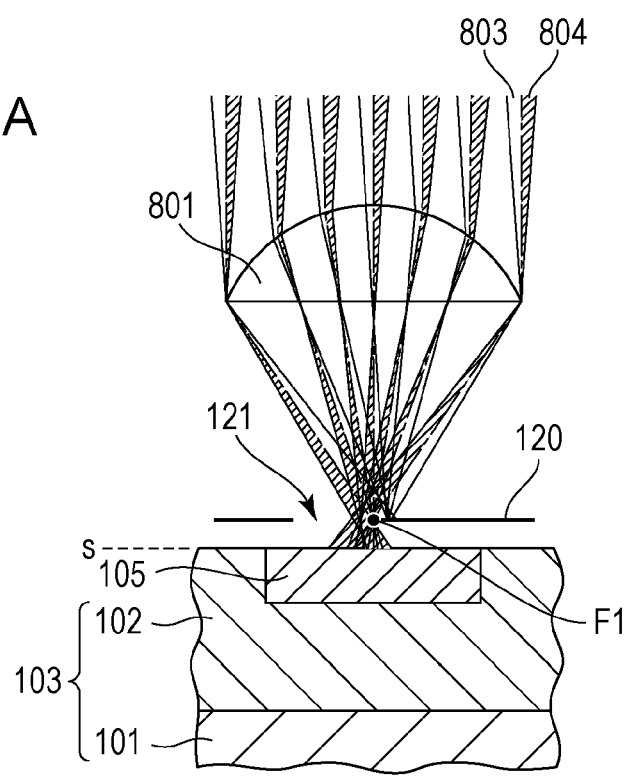
FIG. 8A is a sectional view to explain the photoelectric conversion apparatus according to the first embodiment.
Figure 8B:
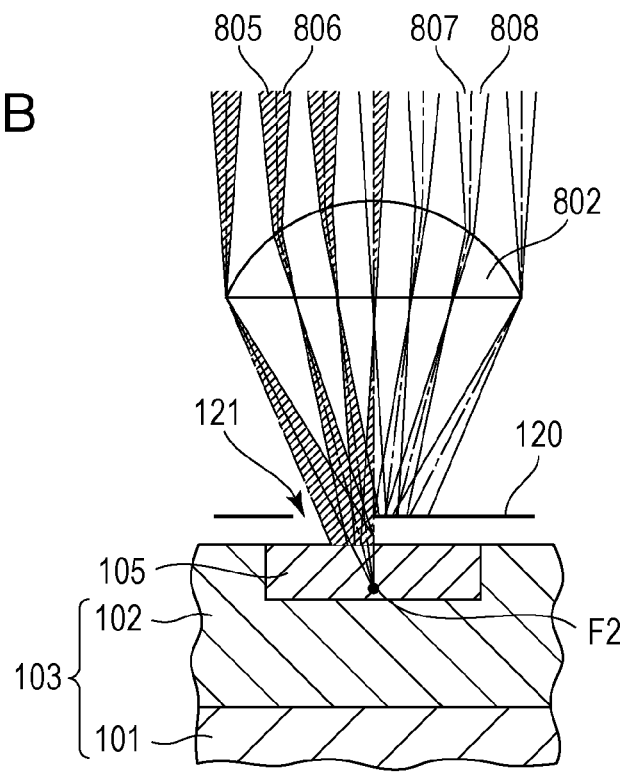
FIG. 8B is a sectional view to explain the photoelectric conversion apparatus according to the first embodiment.

The height of the light shielding film 120 will be described below with reference to FIGS. 8A and 8B. FIGS. 8A and 8B are schematic sectional views illustrating the PD serving as the photoelectric conversion element, the light shielding film 120, microlenses 801 and 802, and incident light beams 803 to 808 in the focus detection pixel 301b. Here, the same components as those in FIG. 1 are denoted by the same reference numerals, and description of those components is omitted.

A focus position adapted for the focus detection pixel is first described with reference to the two microlenses 801 and 802. The microlens is arranged in not only the focus detection pixel 301b, but also the image pickup pixel 301a in one-to-one relation to pixel. A focal point F1 of the microlens 801 in FIG. 8A is positioned near the light shielding film 120, and a focal point F2 of the microlens 802 in FIG. 8B is positioned farther away from the light shielding film 120 than that of the microlens 801 in FIG. 8A. In FIGS. 8A and 8B, there are illustrated light beams 803, 805 and 807 (forming an image A) from one of two divided exit pupil regions, and light beams 804, 806 and 808 (forming an image B) from the other of the two divided exit pupil regions. By comparing the image A and the image B, a signal for use in the focus detection may be obtained. Of the light beams 803 to 808, the light beams 804 to 806 indicated by hatching are incident on the PD, while the light beams 803, 807 and 808 not indicated by hatching are not incident on the PD. As seen from FIGS. 8A and 8B, the light beams forming the image A may be blocked and the light beams forming the image B may be allowed to enter the PD in FIG. 8A where the focal point of the microlens is closer to the light shielding film 120.

Here, when the light shielding film 120 is apart away from the surface S of the semiconductor substrate 103, the desired light is caused to spread through diffraction and the quantity of light incident on the PD is reduced. Further, in general, one of a plurality of wiring layers or wiring patterns in the plurality of wiring layers define the light incident on the photoelectric conversion element. If the light shielding film 120 is positioned above the wiring layer defining an opening for the incident light, i.e., if the light shielding film 120 is positioned away from the surface S of the semiconductor substrate 103, stray light from an adjacent pixel is more apt to mix into the relevant pixel when the light beam is separated or after the light beam has been separated. Accordingly, information necessary for the focus detection is reduced, or accuracy in the focus detection is degraded due to mixing of useless information. By arranging the light shielding film 120 closer to the surface S of the semiconductor substrate 103 than the lowermost wiring layer 118 as illustrated in FIG. 1, the light beam may be separated while the lowermost wiring layer 118 functions to reduce the stray light from the adjacent pixel. In other words, the diffracted light is not shaded by the lowermost wiring layer 118 and is avoided from becoming stray light into the adjacent pixel.

As seen from comparison between FIGS. 8A and 8B, when the light shielding film 120 is apart away from the surface S of the semiconductor substrate 103, the focus position of the microlens is also to be positioned away from the surface S of the semiconductor substrate 103. In other words, the curvature of the microlens has to be increased. However, a general method of manufacturing a microlens has a difficulty in increasing the curvature of the microlens. For that reason, the light shielding film 120 is to be positioned, as illustrated in FIG. 1, close to the surface S of the semiconductor substrate 103, i.e., closer to the surface S of the semiconductor substrate 103 than the wiring layer 118 that is the wiring layer closest to the semiconductor substrate 103. Further, the microlens for the image pickup pixel may be designed such that the focal point of the microlens is positioned on the light receiving surface of the PD. Thus, by arranging the light shielding film 120 closer to the surface S of the semiconductor substrate 103 than the wiring layer 118 closest to the semiconductor substrate 103, the same microlens as that for the image pickup pixel may also be used for the focus detection pixel without degrading the accuracy in the focus detection.

It is to be noted that, in FIG. 1, the upper surface 123 of the light shielding film 120 is positioned substantially at the same height as the lower surface of the wiring layer 118, the upper surface of the contact plug 115, and the upper surface of the insulating film 112. In this embodiment, the expression "substantially same height" includes the case where heights differ from each other by an amount corresponding to an error in manufacturing.

A method of manufacturing a portion of the photoelectric conversion apparatus, illustrated in FIG. 1, the portion including the focus detection pixel 301b, will be described below with reference to FIGS. 2A to 2F. FIGS. 2A to 2F are each a sectional view of the focus detection pixel 301b in the photoelectric conversion apparatus illustrated in FIG. 1. Components in FIGS. 2A to 2F corresponding to those in FIG. 1 are denoted by the same reference numerals and description of those components is omitted.

Figure 2A:
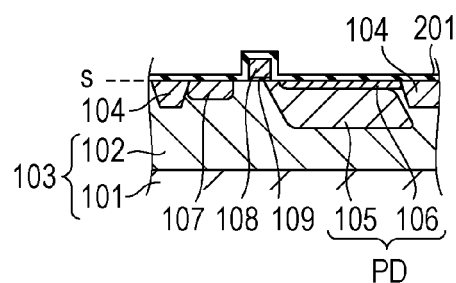
FIG. 2A is a sectional view to explain a method of manufacturing the photoelectric conversion apparatus according to the first embodiment.
Figure 2D:
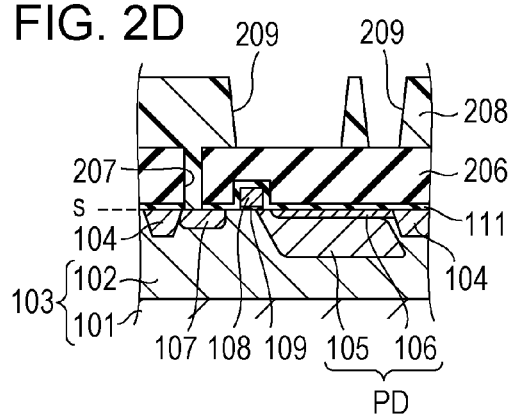
FIG. 2D is a sectional view to explain the method of manufacturing the photoelectric conversion apparatus according to the first embodiment.

First, as illustrated in FIG. 2A, a semiconductor substrate including various elements formed therein is prepared. While only the PD and the transfer transistor are formed here in the semiconductor substrate 103, the pixel transistors, the transistors constituting circuits other than in the pixel region, etc. are also formed in the semiconductor substrate 103 (though not illustrated).

Figure 2B:
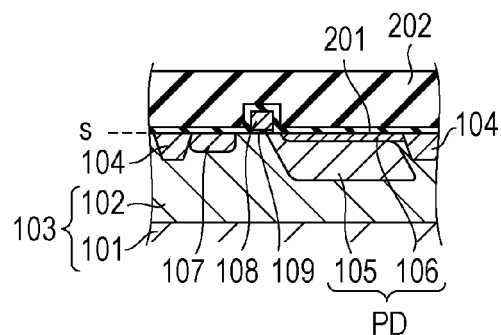
FIG. 2B is a sectional view to explain the method of manufacturing the photoelectric conversion apparatus according to the first embodiment.

An insulating film 201 and an insulating film 202 both covering the elements are formed on the semiconductor substrate 103 illustrated in FIG. 2A. The insulating film 201 is made of silicon nitride, and it becomes the insulating film 111 later. The insulating film 201 is formed by, e.g., the plasma CVD method or the low-pressure plasma CVD method. The insulating film 201 has a surface following the shape of the gate electrode 108, etc. The insulating film 202 is made of silicon nitride or BPSG, and it becomes the insulating film 112 later. Here, the insulating film 202 is formed by, e.g., the plasma CVD method. The surface of the insulating film 202 is planarized by, e.g., the CMP method (FIG. 2B).

Figure 2E:
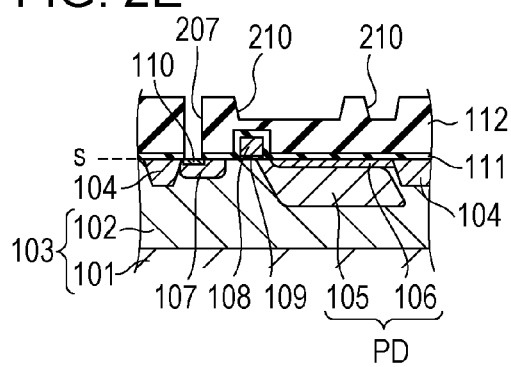
FIG. 2E is a sectional view to explain the method of manufacturing the photoelectric conversion apparatus according to the first embodiment.
Figure 2C:
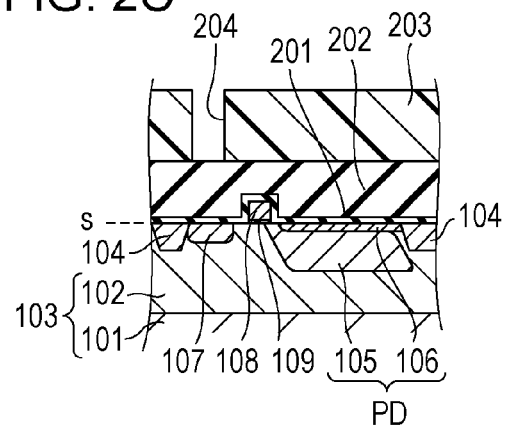
FIG. 2C is a sectional view to explain the method of manufacturing the photoelectric conversion apparatus according to the first embodiment.

Next, as illustrated in FIG. 2C, a photoresist pattern 203 is formed on the insulating film 202. The photoresist pattern 203 is formed by patterning a photoresist film into a predetermined pattern. The photoresist pattern 203 has an opening 204. In such a state, etching is carried out on the insulating film 202 with the photoresist pattern 203 used as a mask. Etching is further carried out on the insulating film 201 to form a contact hole for the contact plug 115 illustrated in FIG. 1. Thus, the insulating film 202 becomes an insulating film 206 having a contact hole 207 illustrated in FIG. 2D. The insulating film 201 may function as an etching stop when the insulating film 202 is etched. After completion of the etching, the photoresist pattern 203 is removed.

After the step of FIG. 2C, a photoresist pattern 208 is formed on the insulating film 206. The photoresist pattern 208 has an opening 209 to form the light shielding film 120 illustrated in FIG. 1. Further, the photoresist pattern 208 fills the contact hole 207 for the contact plug 115 illustrated in FIG. 1. Etching is carried out on the insulating film 206 with the photoresist pattern 208 used as a mask, thereby forming a groove 210, as illustrated in FIG. 2E, in which the light shielding film 120 is to be formed. The insulating film 206 becomes the insulating film 112 having the groove 210 illustrated in FIG. 2E. In this embodiment, the etching to form the groove 210 is controlled such that the groove 210 formed by the etching is shallower than the contact hole 207. In other words, the distance between the upper and lower surfaces of the contact plug 115 formed later is longer than that between the upper and lower surfaces of the light shielding film 120. After completion of the etching, the photoresist pattern 208 is removed.

In FIG. 2E, a semiconductor region 110 for connection with the contact plug 115 is formed in a region where the surface S of the semiconductor substrate 103 is exposed through the contact hole 207. The semiconductor region 110 is formed by carrying out ion implantation with the insulating film 112 used as a mask. Here, the ion implantation is carried out by using arsenic or phosphorus that may form an n-type semiconductor region. That ion implantation may be carried out by using the photoresist pattern 203 after forming the contact hole in FIG. 2C.

After the step of FIG. 2E, a metal film constituting the contact plug 115 and the light shielding film 120 is formed. More specifically, a metal film made of tungsten, for example, is formed by CVD to cover the upper surface of the insulating film 112 and to fill the contact hole 207 and the groove 210. Then, the extra metal film covering the upper surface of the insulating film 112 is removed by the CMP method or the etching method, thereby forming the contact plug 115 and the light shielding film 120. In this state, respective upper surfaces of the contact plug 115, the light shielding film 120, and the insulating film 112 are included in substantially the same plane. Thereafter, the wiring layers, the insulating films, and the plugs are formed through a general semiconductor process, whereby the photoelectric conversion apparatus illustrated in FIG. 1 is formed. It is a matter of course that, in the above-described manufacturing method, each of the metal film, the contact plug, and the wiring layers includes a barrier metal in addition to a metal layer that primarily constitutes it. Further, while the step of forming the contact plug 115 and the step of forming the light shielding film 120 are carried out in the same step (at the same timing) in this embodiment, those steps may be carried out at different timings. As described above, the method of manufacturing the photoelectric conversion apparatus, according to this embodiment, may form the light shielding film that enables the focus detection to be performed with high accuracy.

Figure 4A:
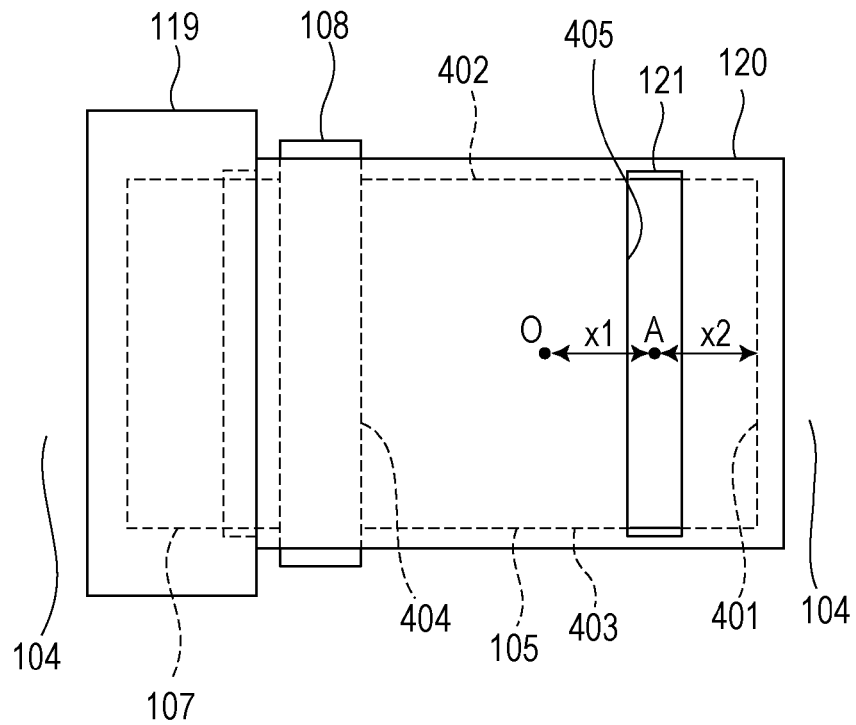
FIG. 4A is a plan view to explain the photoelectric conversion apparatus according to the first embodiment.

The plan layout of the light shielding film 120 will be described below with reference to FIGS. 4A and 4B. FIG. 4A is a schematic plan view of the photoelectric conversion apparatus illustrated in FIG. 1. The schematic plan view of FIG. 4A is a view projected to an arbitrary plane when looking at the surface S of the semiconductor substrate 103 from above perpendicularly to the surface S. FIG. 4A illustrates the semiconductor region 105 forming the PD, the gate electrode 108, the light shielding film 120, the semiconductor region 107 forming the FD, and the wiring layer 119. The gate electrode 108 is arranged between the semiconductor region 105 and the semiconductor region 107, and the wiring layer 119 is arranged in overlapping relation to the semiconductor region 107. The light shielding film 120 is arranged in overlapping relation to the semiconductor region 105. Further, the light shielding film 120 is arranged in overlapping relation to at least a part of the gate electrode 108. Moreover, the light shielding film 120 is arranged in overlapping relation to at least a part of the semiconductor region 107. In fact, the light shielding film 120 is arranged over the semiconductor region 105, the gate electrode 108, and a part of the semiconductor region 107. In other words, the light shielding film 120 is arranged to extend from a position above the semiconductor region 105 so as to overlie the gate electrode 108 and a part of the semiconductor region 107. The arrangement described above may reduce mixing of light (stray light) other than the predetermined light into the photoelectric conversion element and the semiconductor region 107. The contact plug 115 is arranged in the semiconductor region 107. For that reason, the light shielding film 120 is to be not arranged to extend over the entire surface of the semiconductor region 107. More beneficially, the light shielding film 120 is to be not arranged over the semiconductor region 107. This is to avoid electrical connection between the contact plug 115 and the light shielding film 120.

As viewed in the surface S, an area of a region defined by outer edges of the light shielding film 120 is larger than that of a region defined by four sides 401 to 404 of the semiconductor region 105 that constitutes the PD. By so arranging the light shielding film 120 to be larger than the semiconductor region 105, mixing of light (stray light) other than the predetermined light into the photoelectric conversion element may be reduced. Further, the light shielding film 120 and the wiring layer 119 are overlapped with each other. Such an arrangement may further avoid useless light from entering the semiconductor region 107.

In FIG. 4A, a center of the opening 121 in the light shielding film 120 is offset from a center of the semiconductor region 105. In FIG. 4A, the semiconductor region 105 is defined by at least three sides 401 to 403. As viewed from above, outer edges of the semiconductor region 105 are defined by the side 404, which is also one side of the gate electrode 108, and the three sides 401 to 403. Here, a center of a region surrounded by those four sides, i.e., the center of the semiconductor region 105 in the surface S of the semiconductor substrate 103, is denoted by a position O. Further, in FIG. 4A, the center of the opening 121 of in the light shielding film 120 is denoted by a position A. The position O and the position A are offset from each other. An amount of the offset is denoted by a distance X1. Moreover, with respect to one side, e.g., the side 401, defining the semiconductor region 105 in the surface S, a distance between the position A and the side 401 is shorter than that between the position O and the side 401. When the photoelectric conversion element PD is rectangular, for example, the position A is arranged such that, between opposed two of four sides of the rectangle, a distance between the position A and one of the two sides is shorter than that between the position O and the one side. Stated another way, the position O is apart away from the side 401 through a distance corresponding to the sum of the distance X1 and a distance X2, and the position A is apart away from the side 401 through the distance X2. With such an arrangement, a pupil-divided image may be made incident on the photoelectric conversion element. Here, the term "distance" implies the length of a segment interconnecting the position O or the position A and a one certain side through the shortest route.

Moreover, of sides defining the opening 121, a side 405 defining an edge of the opening 121 closer to the position O is arranged at the position O or closer to the side 401 than the position O. This arrangement enables the pupil-divided image to be incident on the photoelectric conversion element.

In the focus detection pixels in pair, those pixels each having the arrangement illustrated in FIG. 4A are arranged in line-symmetrical relation with respect to a segment that is parallel to the direction of a channel width of the gate electrode 108. Alternatively, in the arrangement illustrated in FIG. 4A, the opening 121 is arranged such that a distance between the position A and the side 404 is shorter than that between the position O and the side 404.

A modification of the light shielding film illustrated in FIG. 4A will be described below with reference to FIG. 4B. FIG. 4B is a schematic plan view corresponding to FIG. 4A. The same components in FIG. 4B as those in FIG. 4A are denoted by the same reference numerals and description of those components is omitted. FIG. 4B differs from FIG. 4A in shapes of the light shielding film and the opening therein. In FIG. 4B, a light shielding film 406 has an opening 407. Unlike the opening 121 in FIG. 4A, the opening 407 is not entirely surrounded by the light shielding film 120. The opening 407 may be said as a slit or spacing between two parts of the light shielding film 406. In this modification, a center of the opening 407 is denoted by a position B that is a center of a region surrounded by two sides 408 and 409 as outer edges of the two parts of the light shielding film 120 and by the two sides 402 and 403 of the semiconductor region 105. Similarly to the position A in FIG. 4A, the position B is also offset from the position O and an amount of the offset is denoted by a distance X1. The other relations are similar to those in FIG. 4A. Thus, in the case of the slit-like opening 407 as in this modification, the center of the region surrounded by the outer edges of both the semiconductor region 105 and the light shielding film 406 may be taken as the center of the opening. In other words, the opening may be not entirely surrounded by the light shielding film.

Figure 4B:
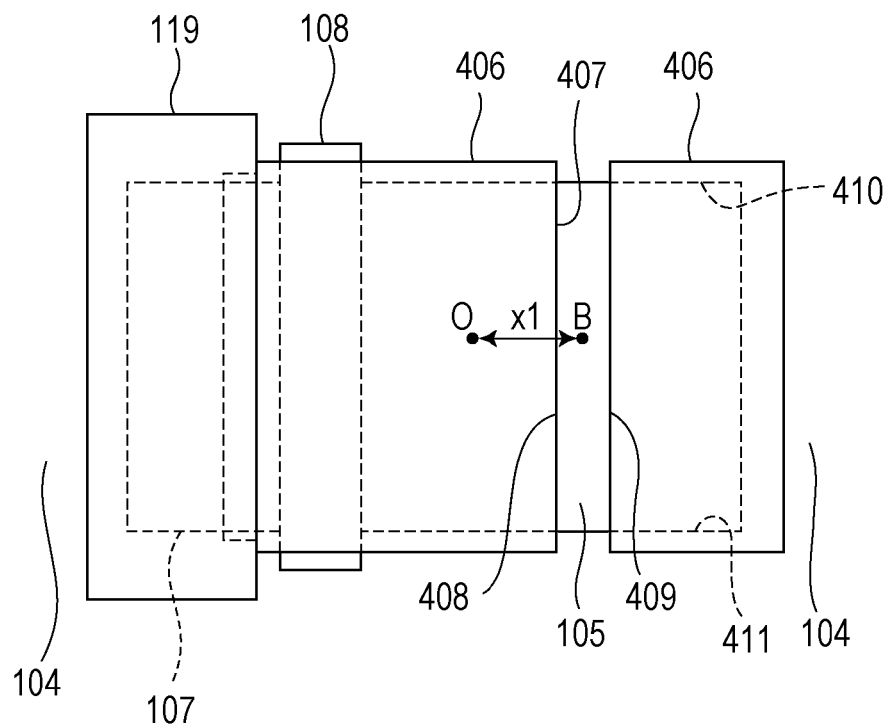
FIG. 4B is a plan view to explain the photoelectric conversion apparatus according to the first embodiment.

In FIGS. 4A and 4B, the light shielding film may be disposed per pixel, or it may be formed to extend over an adjacent pixel, namely it may be integral with the light shielding film in an adjacent pixel. In the latter case, the light shielding film having higher light shielding performance may be provided.

A manufacturing method for practicing an embodiment is not limited to the manufacturing method described in the first embodiment. For example, the groove 210 may be formed prior to the contact hole 207, or the groove 210 may be formed after forming the plug in the contact hole 207.

While the focus detection pixel has been described above in the first embodiment, the light shielding film is not included in the image pickup pixel. A method of manufacturing the image pickup pixel may also be practiced in accordance with the general semiconductor process.

Second Embodiment

Figure 5A:
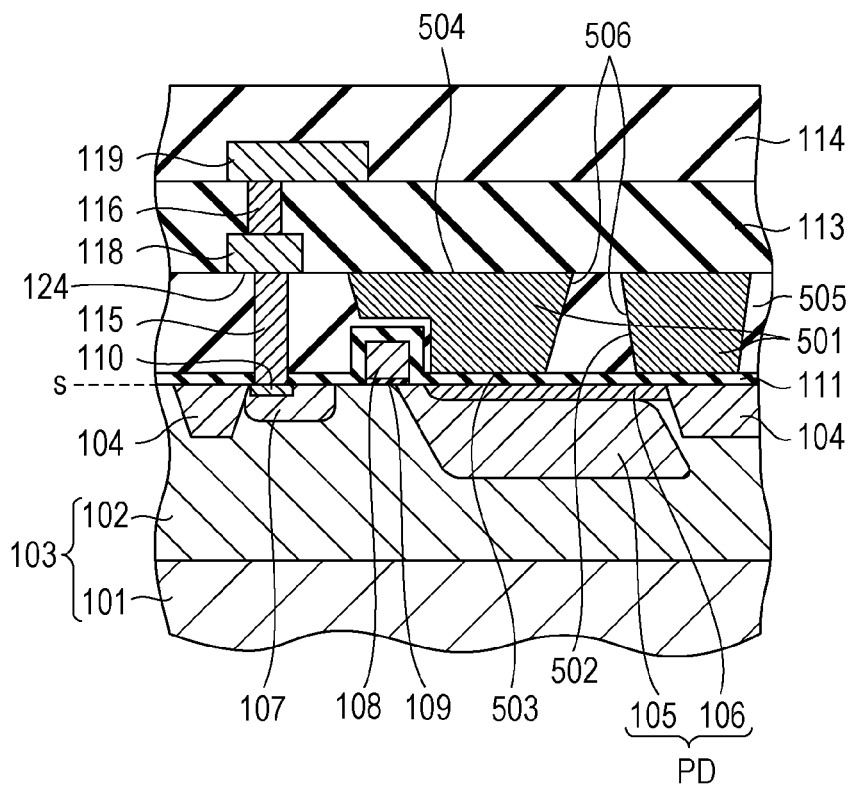
FIG. 5A is a sectional view to explain a photoelectric conversion apparatus according to a second embodiment.

A photoelectric conversion apparatus according to a second embodiment will be described below with reference to FIGS. 5A and 5B. FIG. 5A is a schematic sectional view of the photoelectric conversion apparatus according to the second embodiment, the view corresponding to FIG. 1. The same components in FIG. 5A as those in FIG. 1 are denoted by the same reference numerals and description of those components is omitted. FIG. 5A differs from FIG. 1 in structure of the light shielding film. While, in FIG. 1, the light shielding film 120 is disposed in an upper portion of the insulating film 112, a light shielding film 501 in FIG. 5A is formed in a state penetrating through an insulating film 505. Thus, a bottom surface 503 of a part of the light shielding film 501 is present in a plane including the upper surface of the insulating film 111. Further, an upper surface 504 of the light shielding film 501 is present in a plane including an upper surface of the insulating film 505 and the lower surface 124 of the wiring layer 118. With such an arrangement that the light shielding film 501 is positioned closer to the light receiving surface of the PD than in the structure of FIG. 1, mixing of light other than the predetermined light may be reduced. Further, with that arrangement, lateral surfaces 506 of the light shielding film 501 may reflect light, and the light passing through an opening 502 in the light shielding film 501 may be more easily guided so as to enter the PD.

The structure of FIG. 5A may be formed by partly modifying the manufacturing method described above in the first embodiment. More specifically, in the step of FIG. 2D, the insulating film 206 is etched at a larger depth than in the manufacturing method described above in the first embodiment. For example, the insulating film 206 is etched until the insulating film 111 actually functions as the etching stop. Thus, an opening is formed in the insulating film 206 instead of the groove 210 illustrated in FIG. 2E. After the step of FIG. 2E, the manufacturing method is carried out in a similar manner to that in the first embodiment. As a result, the structure of FIG. 5A may be obtained. Because of including the insulating film 111 that functions as the etching stop, the depth of the etching may be accurately controlled. Further, the presence of the insulating film 111 functioning as the etching stop may reduce an etching damage imposed on the PD.

Figure 5B:
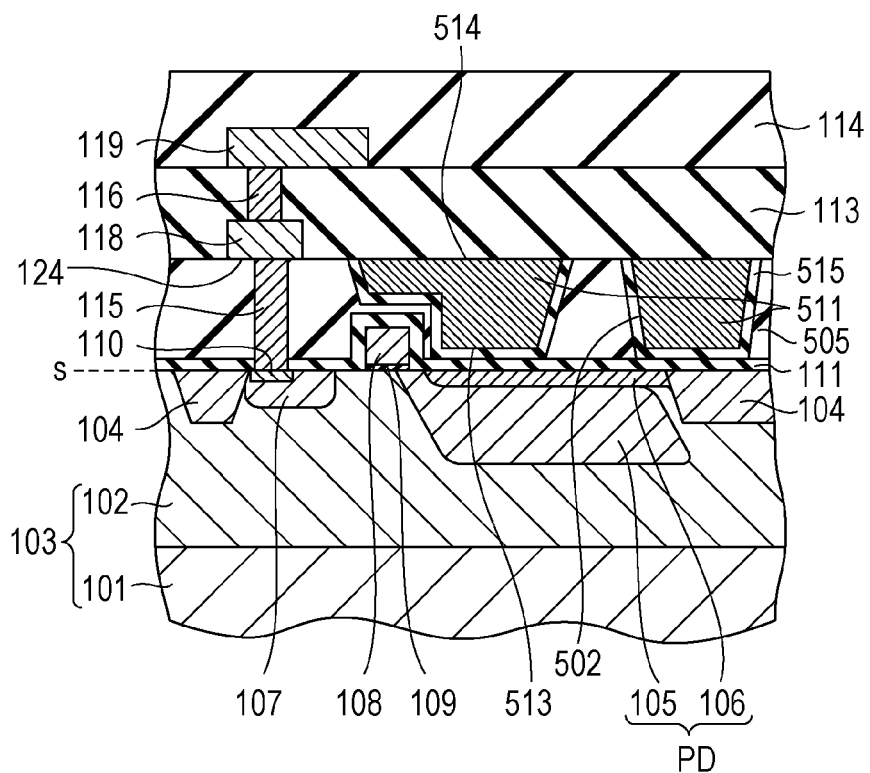
FIG. 5B is a sectional view to explain a modification of the photoelectric conversion apparatus according to the second embodiment.

FIG. 5B illustrates a modification of the structure of FIG. 5A. FIG. 5B is a schematic sectional view corresponding to FIG. 5A. The same components in FIG. 5B as those in FIG. 5A are denoted by the same reference numerals and description of those components is omitted. FIG. 5B differs from FIG. 5A in that the former includes an insulating film 515. The insulating film 515 is disposed between a light shielding film 511 and an insulating film 505. The insulating film 515 is made of silicon nitride, for example, and it may ensure insulation between the gate electrode 108 and the light shielding film 511 and between the PD and the light shielding film 515. Further, the insulating film 515 may suppress diffusion of metals of the light shielding film 511 into the semiconductor substrate 103.

Figure 2F:
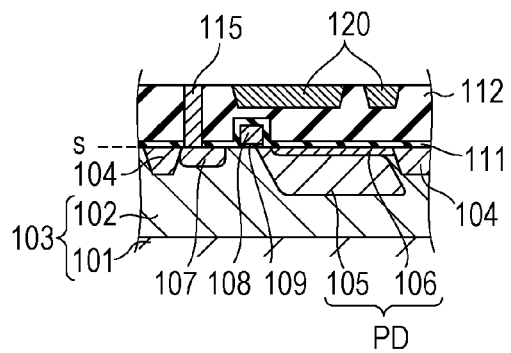
FIG. 2F is a sectional view to explain the method of manufacturing the photoelectric conversion apparatus according to the first embodiment.

The structure of FIG. 5B may be formed in a similar manner to the manufacturing method for the structure of FIG. 5A except for the following point. After forming a silicon nitride film over an inner surface of the opening that is formed instead of the groove 210 illustrated in FIG. 2E, a step of forming a metal film is performed as illustrated in FIG. 2F. As a result, the structure of FIG. 5B may be formed. Alternatively, the contact hole may be formed after the opening and the silicon nitride film. The order in the steps of the manufacturing method may be optionally selected.

Third Embodiment

Figure 6:
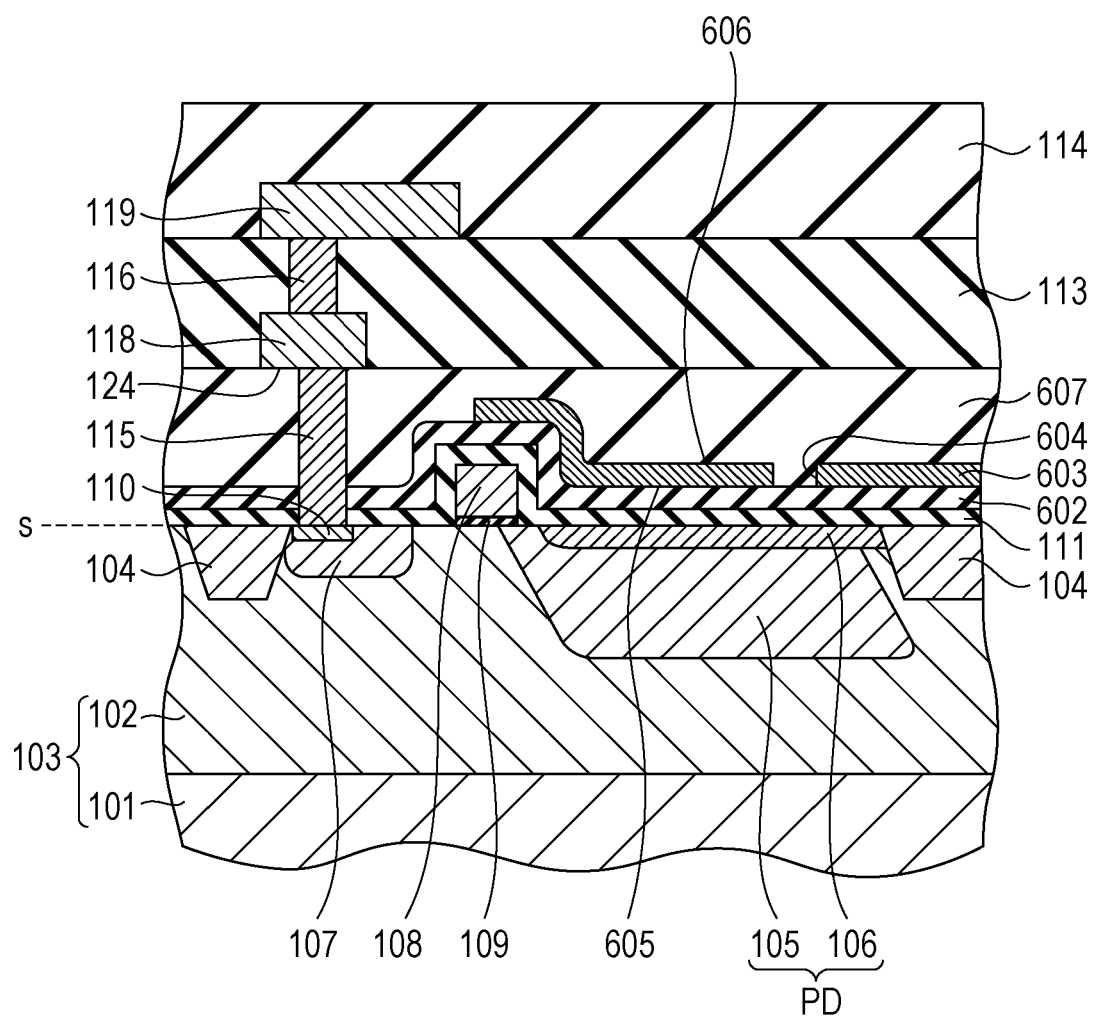
FIG. 6 is a sectional view to explain a photoelectric conversion apparatus according to a third embodiment.

A photoelectric conversion apparatus according to a third embodiment will be described below with reference to FIG. 6. FIG. 6 is a schematic sectional view of the photoelectric conversion apparatus according to the third embodiment, the view corresponding to FIG. 1. The same components in FIG. 6 as those in FIG. 1 are denoted by the same reference numerals and description of those components is omitted. FIG. 6 differs from FIG. 1 in structure of the light shielding film and the insulating film.

In FIG. 6, a light shielding film 603 has an opening 604. The light shielding film 603 has an upper surface 606 and a lower surface 605 following the shape of an underlying structure, i.e., the shape of the gate electrode 108 here. The upper surface 606 of the light shielding film 603 is covered with an insulating film 607. The lower surface 605 of the light shielding film 603 is closer to the surface S of the semiconductor substrate 103 than the lower surface 124 of the wiring layer 118 that is positioned closest to the surface S. Further, the upper surface 606 of the light shielding film 603 is not present in the plane including the upper surface of the contact plug 115 or the lower surface 124 of the wiring layer 118, and it is positioned closer to the surface S than that plane. With such an arrangement, the light shielding film 603 may make the predetermined light of the pupil-divided image incident on the PD with good control performance.

A method of manufacturing a portion of the photoelectric conversion apparatus, illustrated in FIG. 6, the portion including the focus detection pixel, will be described below with reference to FIGS. 7A to 7E. FIGS. 7A to 7E are each a sectional view of the focus detection pixel in the photoelectric conversion apparatus illustrated in FIG. 6. Components in FIGS. 7A to 7E corresponding to those in FIG. 6 are denoted by the same reference numerals and description of those components is omitted. Description of the same steps as those in FIGS. 2A to 2F is also omitted.

Figure 7A:
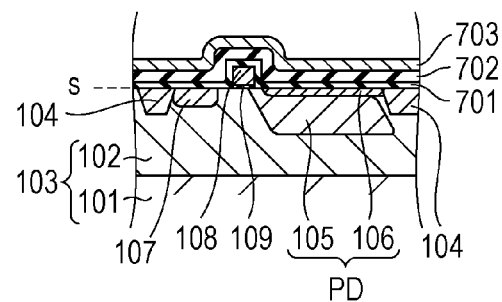
FIG. 7A is a sectional view to explain a method of manufacturing the photoelectric conversion apparatus according to the third embodiment.

First, as illustrated in FIG. 7A, a semiconductor substrate including various elements formed therein is prepared. The step of FIG. 7A is similar to the step of FIG. 2A. Then, as illustrated in FIG. 7A, an insulating film 701 made of silicon nitride and covering the surface S and the gate electrode 108 is formed by, e.g., the CVD method. As in the other embodiments, an insulating film (not illustrated) made of silicon oxide, the insulating film being integral with the gate insulating film 109 or separate from it, may be disposed on the surface S. In that case, the insulating film (not illustrated) is arranged between the insulating film 701 and the surface S. Further, an insulating film 702 made of silicon oxide and covering the insulating film 701 is formed by the CVD method. Here, the insulating film 701 has a refractive index between those of the semiconductor region 105 and the insulating film 702 such that it may function as an anti-reflection film later. A metal film 703 made of tungsten and covering the insulating film 702 is then formed. Here, respective upper surfaces of the insulating film 701, the insulating film 702 and the metal film 703 have shapes following the structure such as the gate electrode 108. Unevenness of the respective upper surfaces of the insulating film 701, the insulating film 702 and the metal film 703 is gradually reduced in the order named. In other words, the upper surface of the insulating film 702 has smaller unevenness, which is attributable to, e.g., a level difference of the gate electrode 108, and has a more moderate shape than the upper surface of the insulating film 701.

Figure 7D:
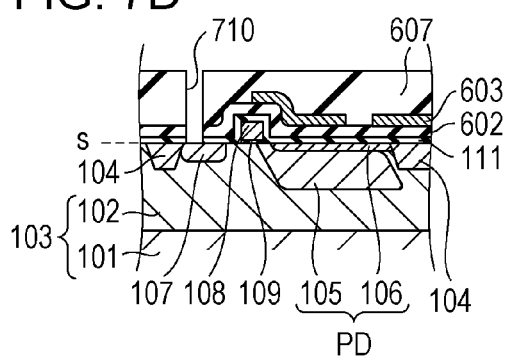
FIG. 7D is a sectional view to explain the method of manufacturing the photoelectric conversion apparatus according to the third embodiment.
Figure 7B:
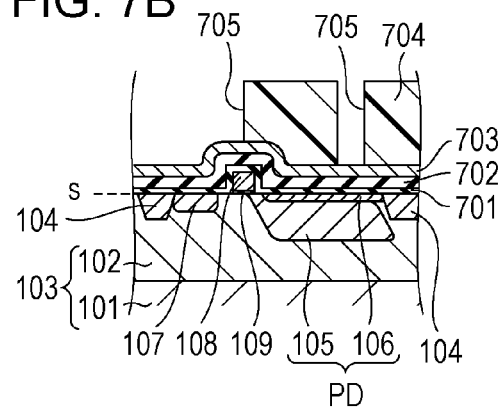
FIG. 7B is a sectional view to explain the method of manufacturing the photoelectric conversion apparatus according to the third embodiment.
Figure 7E:
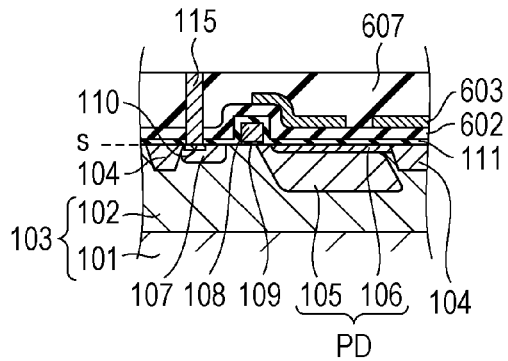
FIG. 7E is a sectional view to explain the method of manufacturing the photoelectric conversion apparatus according to the third embodiment.

Next, a photoresist pattern 704 illustrated in FIG. 7B is formed on the metal film 703. The photoresist pattern 704 has an opening 705. The opening 705 is positioned corresponding to a region of the light shielding film where the opening is to be formed, i.e., a region where the light shielding film is to be removed. Etching is carried out on the metal film 703 with the photoresist pattern 704 used as a mask for patterning of the metal film 703, whereby the light shielding film 603 is formed. Here, because the insulating film 702 is disposed under the metal film 703, the unevenness attributable to the gate electrode 108 is moderated. In the step of FIG. 7B, therefore, the upper surface of the insulating film 702 becomes relatively moderate and the metal film 703 may be easily removed. If the insulating film 702 is not present, there is a possibility that the useless metal film 703 may be not completely removed on a lateral wall of the insulating film 701 covering a lateral wall of the gate electrode 108. The presence of the useless metal film 703 may cause a leak, etc. and may reduce a yield. In other words, a reduction of the yield caused by the presence of the useless metal film 703 may be suppressed by forming the insulating film 702 as in this embodiment.

Further, the insulating film 702 (second insulating film) may function as an etching stop when the patterning of the metal film 703 is performed. Accordingly, the presence of the insulating film 702 may reduce an etching damage imposed on the PD and the insulating film 701. When the insulating film 701 is subjected to the etching, the thickness of the insulating film 701 is changed. The insulating film 701 becomes the insulating film 111 later to be able to function as an antireflection film on the light receiving surface of the PD. While the thickness of the antireflection film is set in consideration of optical characteristics, the optical characteristics are degraded if the film thickness is changed with the etching. Thus, the presence of the insulating film 702 may contribute to maintaining the predetermined optical characteristics.

Figure 7C:
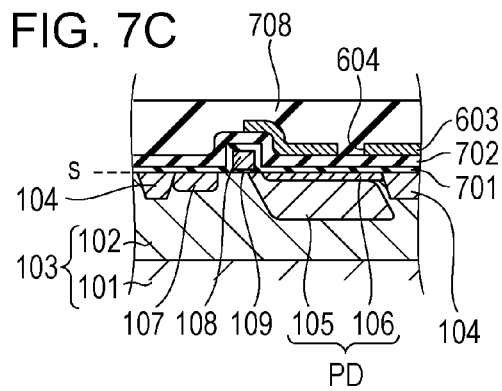
FIG. 7C is a sectional view to explain the method of manufacturing the photoelectric conversion apparatus according to the third embodiment.

Next, as illustrated in FIG. 7C, an insulating film 708 (first insulating film) is formed to cover the insulating film 702 and the light shielding film 603. The insulating film 708 is, for example, made of silicon oxide and formed by the CVD method. A photoresist pattern (not illustrated) is formed on the insulating film 708, and the insulating film 708 and the insulating film 702 are etched with that photoresist pattern used as a mask. Thereafter, the exposed insulating film 701 is removed by etching. The photoresist pattern is then removed. Through the above-described steps, the insulating film 607, the insulating film 602, and the insulating film 111, including a contact hole 710 penetrating through those films, are formed as illustrated in FIG. 7D.

Further, the semiconductor region 110 is formed under the contact hole 710 and a metal is filled into the contact hole 710, thereby forming the contact plug 115. Those steps may be performed in accordance with a semiconductor process similar to that illustrated in FIGS. 2D and 2F, and detailed description of those steps is omitted. The wiring layers, the insulating films, and the plugs are then formed through a general semiconductor process, whereby the photoelectric conversion apparatus illustrated in FIG. 6 is formed.

While both the insulating film 701 and the insulating film 702, i.e., both the insulating film 111 and the insulating film 602, are formed in this embodiment, the insulating film 701 may be formed in a larger thickness without forming the insulating film 702. In such a case, the insulating film 701 functions also as an etching stop to reduce the etching damage imposed on the PD. As an alternative, the insulating film 702 may be formed in a larger thickness without forming the insulating film 701.

As an application example of the photoelectric conversion apparatus according to any of the foregoing embodiments to an image pickup system, a camera incorporating the relevant photoelectric conversion apparatus will be described below. Here, the concept of the camera includes not only a device primarily intended for photographing, but also a device (such as a personal computer or a portable terminal) having the photographing function as an auxiliary function. The camera includes the photoelectric conversion apparatus according to one of the foregoing embodiments, and a signal processing unit for processing a signal output from the photoelectric conversion apparatus. The signal processing unit may include, e.g., an A/D converter and a processor for processing digital data output from the A/D converter.

While the photoelectric conversion apparatus according to one embodiment may include only the focus detection pixel 301*b*, it is more beneficial that the photoelectric conversion apparatus additionally includes the image pickup pixel as well.

With the photoelectric conversion apparatus according to the embodiment, since the pupil division is made at a position close to the surface of the photoelectric conversion element, the accuracy in the focus detection may be increased. Further, with the manufacturing method according to the embodiment, the light shielding film enabling the focus detection to be performed with high accuracy may be formed.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2011-119260 filed May 27, 2011, which is hereby incorporated by reference herein in its entirety.

What is claimed is:

1. A photoelectric conversion apparatus comprising a photoelectric conversion element having a light receiving surface, a plurality of wiring layers to read a signal from the photoelectric conversion element, and a contact plug for connection with a lowermost one of the plurality of wiring layers,
    wherein the photoelectric conversion apparatus further comprises a light shielding film covering a part of the photoelectric conversion element, and having a lower surface positioned closer to a plane, which includes the light receiving surface of the photoelectric conversion element, than a lower surface of the lowermost one of the plurality of wiring layers, and wherein the contact plug is disposed extending in height from the lower surface of the lowermost one of the plurality of wiring layer to the lower surface of the light shielding film.

2. The photoelectric conversion apparatus according to claim 1, wherein the light shielding film has an opening, and a center of the opening is offset from a center of the light receiving surface of the photoelectric conversion element.

3. The photoelectric conversion apparatus according to claim 1, wherein the photoelectric conversion apparatus further comprises a plurality of other pixels each having a light receiving surface.

4. The photoelectric conversion apparatus according to claim 3, wherein the photoelectric conversion apparatus further comprises microlenses disposed in the plurality of other pixels.

5. An image pickup system comprising:
the photoelectric conversion apparatus according to claim 1, and
at least one signal processing unit configured to process an output signals from the photoelectric conversion apparatus.

6. A photoelectric conversion apparatus comprising a plurality of pixels, each pixel including a photoelectric conversion element, the photoelectric conversion element having a light receiving surface, and a plurality of wiring layers to read a signal from the photoelectric conversion element, wherein the photoelectric conversion apparatus further comprises a light shielding film covering a part of the photoelectric conversion element and having a lower surface positioned closer to a plane, which includes the light receiving surface of the photoelectric conversion element, than a lower surface of the lowermost one of the plurality of wiring layers, and wherein the lower surface of the lowermost wiring layer and an upper surface of the light shielding film are positioned at a same height.

7. A photoelectric conversion apparatus according comprising a plurality of pixels, each pixel including a photoelectric conversion element, the photoelectric conversion element having a light receiving surface, and a plurality of wiring layers to read a signal from the photoelectric conversion element, wherein the photoelectric conversion apparatus further comprises a light shielding film covering a part of the photoelectric conversion element and having a lower surface positioned closer to a plane, which includes the light receiving surface of the photoelectric conversion element, than a lower surface of the lowermost one of the plurality of wiring layers, and wherein the photoelectric conversion apparatus includes a contact plug for connection with the lowermost wiring layer, and an upper surface of the contact plug and an upper surface of the light shielding film are positioned at a same height.

8. The photoelectric conversion apparatus according to claim 7, wherein a distance between the upper surface and a lower surface of the contact plug is longer than a distance between the upper surface and the lower surface of the light shielding film.

9. A photoelectric conversion apparatus comprising a plurality of pixels, each pixel including a photoelectric conversion element, the photoelectric conversion element having a light receiving surface, and a plurality of wiring layers to read a signal from the photoelectric conversion element, wherein the photoelectric conversion apparatus further comprises a light shielding film covering a part of the photoelectric conversion element and having a lower surface positioned closer to a plane, which includes the light receiving surface of the photoelectric conversion element, than a lower surface of the lowermost one of the plurality of wiring layers, wherein the pixel includes a transfer transistor configured to read the output signal, and the light shielding film extends from a position above a part of the photoelectric conversion element to a position above at least a part of a gate electrode of the transfer transistor.

10. The photoelectric conversion apparatus according to claim 9, wherein the light shielding film is not present above a drain of the transfer transistor.

11. A method of manufacturing a photoelectric conversion apparatus comprising a plurality of pixels each including a photoelectric conversion element, and a plurality of wiring layers to read a signal from the photoelectric conversion element, the method comprising the steps of:
forming an insulating film that covers the photoelectric conversion element;
forming a contact hole in the insulating film;
forming a contact plug in the contact hole;
forming a groove in the insulating film, the groove overlying a part of the photoelectric conversion element; and
forming an opaque film in the groove.

12. The method of manufacturing the photoelectric conversion apparatus according to claim 11, further comprising forming the lowermost one of the plurality of wiring layers on the insulating film.

13. The method of manufacturing the photoelectric conversion apparatus according to claim 11, wherein the forming the contact plug in the contact hole and the forming the groove in the insulating film are performed in a same step.

14. A method of manufacturing a photoelectric conversion apparatus comprising a plurality of pixels each including a photoelectric conversion element, and a plurality of wiring layers to read a signal from the photoelectric conversion element, the method comprising:
forming a first insulating film that covers the photoelectric conversion element;
forming an opaque film that covers the first insulating film;
patterning the opaque film to form a light shielding film that covers a part of the photoelectric conversion element;
forming a second insulating film that covers the light shielding film;
forming a contact plug in a hole penetrating through the first insulating film and the second insulating film; and
forming the lowermost one of the plurality of wiring layers on the second insulating film.

15. The method of manufacturing the photoelectric conversion apparatus according to claim 14, wherein the first insulating film functions as an etching stop in the forming the light shielding film.

* * * * *